(12) United States Patent
Tsubata

(10) Patent No.: US 11,682,441 B2
(45) Date of Patent: Jun. 20, 2023

(54) MAGNETORESISTIVE MEMORY DEVICE AND METHOD OF MANUFACTURING MAGNETORESISTIVE MEMORY DEVICE

(71) Applicant: Kioxia Corporation, Tokyo (JP)

(72) Inventor: Shuichi Tsubata, Seoul (KR)

(73) Assignee: Kioxia Corporation, Tokyo (JP)

( * ) Notice: Subject to any disclaimer, the term of this patent is extended or adjusted under 35 U.S.C. 154(b) by 32 days.

(21) Appl. No.: 17/495,999

(22) Filed: Oct. 7, 2021

(65) Prior Publication Data

US 2022/0028441 A1 Jan. 27, 2022

Related U.S. Application Data

(62) Division of application No. 16/565,316, filed on Sep. 9, 2019, now abandoned.

(30) Foreign Application Priority Data

Mar. 15, 2019 (JP) .............................. JP2019-048676

(51) Int. Cl.
| | |
|---|---|
| *G11C 11/16* | (2006.01) |
| *H10B 61/00* | (2023.01) |
| *H10N 50/01* | (2023.01) |
| *H10N 50/10* | (2023.01) |
| *H10N 50/85* | (2023.01) |

(52) U.S. Cl.
CPC ............ *G11C 11/161* (2013.01); *H10B 61/00* (2023.02); *H10N 50/01* (2023.02); *H10N 50/10* (2023.02); *H10N 50/85* (2023.02)

(58) Field of Classification Search
CPC ...... G11C 11/161; H10B 61/00; H10N 50/10; H10N 50/85
See application file for complete search history.

(56) References Cited

U.S. PATENT DOCUMENTS

| 7,919,826 B2 | 4/2011 | Iwayama et al. |
| 7,931,976 B2 | 4/2011 | Ohsawa et al. |
| (Continued) | | |

FOREIGN PATENT DOCUMENTS

| CN | 108352444 A | 7/2018 |
| JP | 5191717 B2 | 10/2007 |
| (Continued) | | |

OTHER PUBLICATIONS

Office Action (Final Rejection) dated Jul. 12, 2021, issued in U.S. Appl. No. 16/565,316.

(Continued)

*Primary Examiner* — Antonio B Crite
(74) *Attorney, Agent, or Firm* — Holtz, Holtz & Volek PC

(57) ABSTRACT

According to an embodiment, a magnetoresistive memory device includes a layer stack. The layer stack includes a first ferromagnet, an insulator on the first ferromagnet, and a second ferromagnet on the insulator. A nonmagnet is provided above the layer stack. A first conductor is provided on the nonmagnet. A hard mask is provided above the first conductor. The nonmagnet includes a material that is removed at a first etching rate against a first ion beam. The first conductor includes a material that is removed at a second etching rate against the first ion beam. The first etching rate is lower than the second etching rate.

5 Claims, 6 Drawing Sheets

(56) References Cited

U.S. PATENT DOCUMENTS

| | | |
|---|---|---|
| 8,223,464 B2 | 7/2012 | Yasui et al. |
| 9,508,922 B2 | 11/2016 | Yoshikawa et al. |
| 9,595,663 B2 | 3/2017 | Yoshikawa et al. |
| 9,698,338 B2 | 7/2017 | Yoshikawa et al. |
| 9,893,121 B2 | 2/2018 | Sonoda et al. |
| 10,020,444 B2 | 7/2018 | Tsubata et al. |
| 10,147,761 B2 | 12/2018 | Yoshikawa et al. |
| 10,177,302 B2 | 1/2019 | Tsubata et al. |
| 10,230,042 B2 | 3/2019 | Yoshikawa et al. |
| 10,388,855 B2 | 8/2019 | Tsubata et al. |
| 10,461,245 B2 | 10/2019 | Tsubata et al. |
| 10,490,732 B2 | 11/2019 | Sonoda et al. |
| 10,847,576 B2 | 11/2020 | Tsubata et al. |
| 2012/0075922 A1 | 3/2012 | Yamada et al. |
| 2016/0064653 A1 | 3/2016 | Seto et al. |
| 2016/0072047 A1 | 3/2016 | Seto et al. |
| 2016/0072055 A1 | 3/2016 | Seto et al. |
| 2016/0133307 A1 | 5/2016 | Lee et al. |
| 2017/0125668 A1 | 5/2017 | Paranjpe et al. |
| 2017/0263860 A1 | 9/2017 | Seto et al. |
| 2018/0123029 A1* | 5/2018 | Park ............... H10N 50/01 |
| 2018/0269386 A1 | 9/2018 | Tsubata et al. |
| 2021/0074762 A1 | 3/2021 | Tsubata |
| 2021/0287727 A1 | 9/2021 | Tsubata et al. |

FOREIGN PATENT DOCUMENTS

| | | |
|---|---|---|
| JP | 2008294420 A | 12/2008 |
| JP | 2010113782 A | 5/2010 |

OTHER PUBLICATIONS

Office Action (Non-Final Rejection) dated Jan. 7, 2021, issued in U.S. Appl. No. 16/565,316.

* cited by examiner

MAGNETORESISTIVE MEMORY DEVICE AND METHOD OF MANUFACTURING MAGNETORESISTIVE MEMORY DEVICE

CROSS-REFERENCE TO RELATED APPLICATIONS

This application is a Divisional Application of U.S. application Ser. No. 16/565,316, filed Sep. 9, 2019, which is based upon and claims the benefit of priority from Japanese Patent Application No. 2019-48676, filed Mar. 15, 2019, the entire contents of all of which are incorporated herein by reference.

FIELD

Embodiments described herein relate generally to a magnetoresistive memory device and a method of manufacturing the magnetoresistive memory device.

BACKGROUND

A magnetoresistive memory device using a magnetoresistive effect element is known.

DETAILED DESCRIPTION

Figure 1:
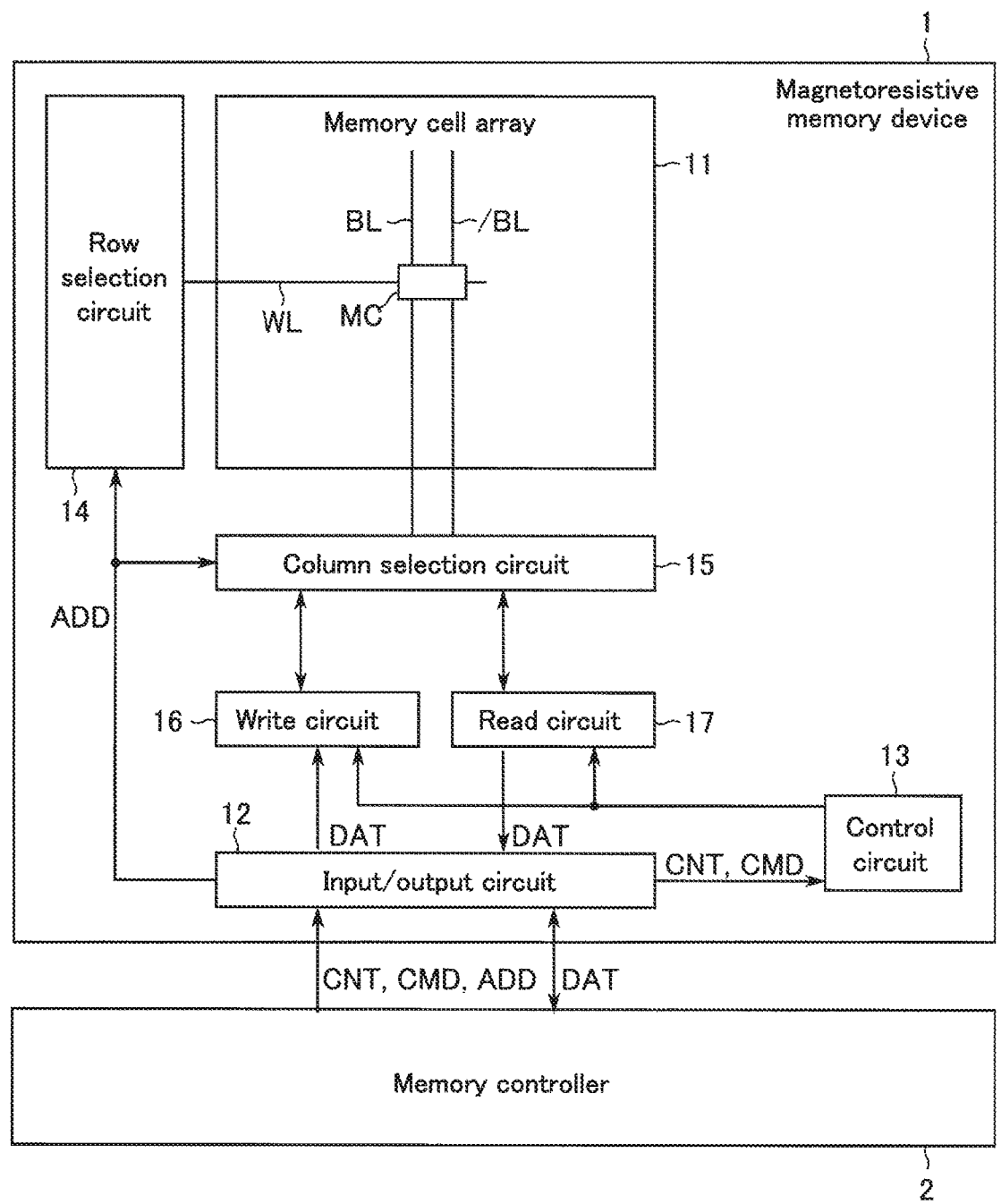
FIG. 1 shows functional blocks of a magnetoresistive memory device of a first embodiment.

According to an embodiment, a magnetoresistive memory device includes a layer stack. The layer stack includes a first ferromagnet, an insulator on the first ferromagnet, and a second ferromagnet on the insulator. A nonmagnet is provided above the layer stack. A first conductor is provided on the nonmagnet. A hard mask is provided above the first conductor. The nonmagnet includes a material that is removed at a first etching rate against a first ion beam. The first conductor includes a material that is removed at a second etching rate against the first ion beam. The first etching rate is lower than the second etching rate.

Embodiments will now be described with reference to the figures.

In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones.

The entire description for a particular embodiment also applies to another embodiment unless it is explicitly mentioned otherwise or obviously eliminated. Each embodiment illustrates the device and method for materializing the technical idea of that embodiment, and the technical idea of an embodiment does not specify the quality of the material, shape, structure, arrangement of components, etc. to the following.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1.1. Configuration (Structure)>

FIG. 1 shows functional blocks of the magnetoresistive memory device according to the first embodiment. As shown in FIG. 1, a magnetoresistive memory device 1 includes a memory cell array 11, an input/output circuit 12, a control circuit 13, a row selection circuit 14, a column selection circuit 15, a write circuit 16, and a read circuit 17.

The memory cell array 11 includes memory cells MC, word lines WL, bit lines BL, and bit lines /BL. One bit line BL and one bit line /BL constitute one bit line pair.

The memory cell MC can store data in a non-volatile manner. Each memory cell MC is coupled to one word line WL and a pair of bit lines BL and /BL. Each word line WL is associated with a row. Each pair of bit lines BL and /BL is associated with a column. Selection of one row and selection of one or more columns specify one or more memory cells MC.

The input/output circuit 12 receives various types of a control signal CNT, various types of a command CMD, an address signal ADD, and data (write data) DAT, for example, from a memory controller 2, and transmits data (read data) DAT to, for example, the memory controller 2.

The row selection circuit 14 receives the address signal ADD from the input/output circuit 12, and brings one word line WL corresponding to the row that is based on the received address signal ADD into a selected state.

The column selection circuit 15 receives the address signal ADD from the input/output circuit 12 and brings bit lines BL corresponding to the column that is based on the received address signal ADD into a selected state.

The control circuit 13 receives the control signal CNT and the command CMD from the input/output circuit 12. The control circuit 13 controls the write circuit 16 and the read circuit 17 based on control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input/output circuit 12 and supplies the voltages used for data writing to the column selection circuit 15 based on the control by the control circuit 13 and the write data DAT.

The read circuit 17 includes a sense amplifier, and based on the control of the control circuit 13, uses the voltages used for data reading to determine data stored in the memory cells MC. The determined data is supplied to the input/output circuit 12 as the read data DAT.

Figure 2:
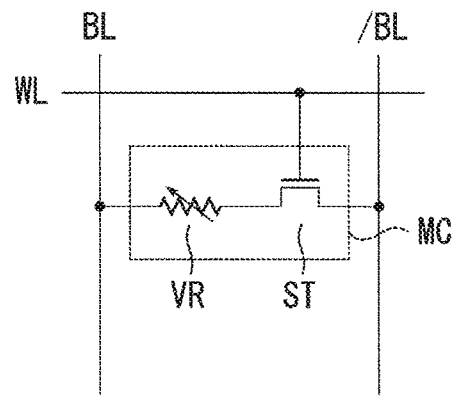
FIG. 2 is a circuit diagram of one memory cell of the first embodiment.

FIG. 2 is a circuit diagram of one memory cell MC of the first embodiment. The memory cell MC includes a variable resistance element VR and a select transistor ST. In a steady state, the variable resistance element VR can be in a selected resistance state of two resistance states, and the resistance of one of the two resistance states is higher than the resistance of the other. The variable resistance element VR can switch between the low resistance state and the high resistance state, and can store one bit of data using the difference between the two resistance states. The variable resistance element VR exhibits, for example, a magnetoresistive effect, and includes, for example, a magnetic tunnel junction (MTJ) element. The MTJ element refers to a structure including an MTJ.

The select transistor ST can be, for example, an n-type metal oxide semiconductor field effect transistor (MOSFET).

A variable resistance element VR is coupled to one bit line BL at its first end, and is coupled to a first end of the select transistor ST at its second end. A second end of the select transistor ST is coupled to the bit line /BL. The gate of the select transistor ST is coupled to one word line WL, and the source is coupled to the bit line /BL. Although an example is described in which the memory cell MC includes the three-terminal select transistor ST as a switching element, the memory cell MC is not limited to this form. Any switching element can be used as long as it can select the memory cell MC and allow for writing and reading data to and from the selected memory cell MC. Such a switching element includes, for example, a switching element having a two-terminal switching function.

The following description is based on an example in which the variable resistance element VR includes an MTJ element.

Figure 3:
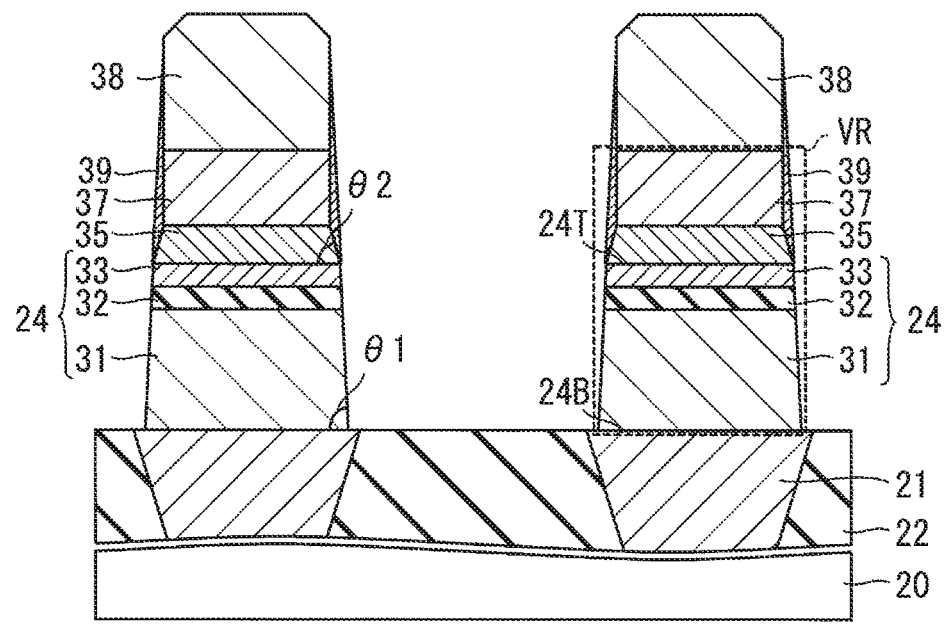
FIG. 3 shows a structure of part of the memory cell array of the first embodiment.

FIG. 3 shows a structure of part of the memory cell array 11 of the first embodiment. More specifically, FIG. 1 shows the resistance change element VR of each of two adjacent memory cells MC and the periphery thereof.

Two independent bottom electrodes 21 are provided above a substrate 20. An inter-layer insulator 22 is provided in the area between the bottom electrodes 21. The inter-layer insulator 22 fills, for example, the area between the bottom electrodes 21.

One variable resistance element VR is provided on the upper face of each bottom electrode 21. Each variable resistance element VR includes a layer stack 24, a nonmagnet 35, and a conductor 37.

The layer stack 24 exhibits a tunnel magnetoresistive effect and can function as an MTJ element. As such an example, the layer stack 24 includes a ferromagnet 31, an insulator 32, and a ferromagnet 33. The layer stack 24 may include an additional layer.

The ferromagnet 31 is located on the upper face of the bottom electrode 21 and includes, for example, one or more of cobalt platinum (CoPt), cobalt nickel (CoNi), and cobalt palladium (CoPd), or is made of any one of CoPt, CoNi, and CoPd.

The insulator 32 is located on the upper face of the ferromagnet 31. The insulator 32 includes a nonmagnetic insulator or is made of a nonmagnetic insulator. For example, the insulator 32 includes or is made of magnesium oxide (MgO).

The ferromagnet 33 is located on the upper face of the insulator 32, and includes, for example, one or more of cobalt iron boron (CoFeB) and iron boride (FeB), or is made of any one of CoFeB and FeB.

The variable resistance element VR may include an additional layer. Such a layer includes, for example, one or more conductors between the ferromagnet 31 and the bottom electrode 21. The conductor has a function of facilitating the crystallinity of one or more of the ferromagnet 31, the insulator 32, and the ferromagnet 33, for example, and can function as a so-called base layer or a buffer layer.

Figure 4:
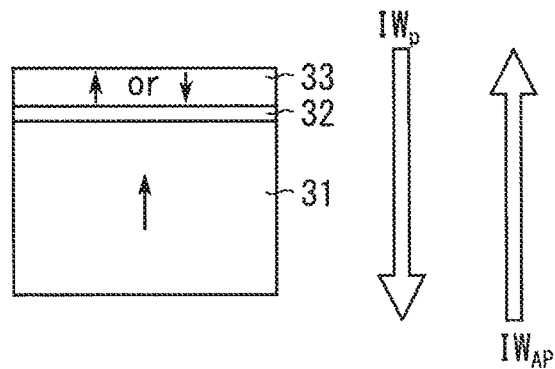
FIG. 4 shows an example of the state of magnetization of an MTJ element of the first embodiment.

The ferromagnets 31 and 33 have magnetization, as shown in FIG. 4, and have for example, a magnetization easy axis along a direction passing through the interfaces of the ferromagnet 31, the insulator 32, and the ferromagnet 33 (indicated by arrows). The ferromagnets 31 and 32 may have a magnetization easy axis along the interfaces of the ferromagnet 31, the insulator 32, and the ferromagnet 33.

The direction of magnetization of the ferromagnet 31 remains unchanged by the normal operation of the magnetoresistive memory device 1, that is, even by reading and writing of data, and can function as a so-called reference layer. On the other hand, the direction of magnetization of the ferromagnet 33 is variable, and can function as a so-called storage layer. The insulator 32 can function as a tunnel barrier.

Specifically, when the directions of magnetization of the ferromagnets 31 and 32 are parallel, the layer stack 24 exhibits a resistance value Rp. On the other hand, when the directions of magnetization of the ferromagnets 31 and 32 are antiparallel, the layer stack 24 exhibits a resistance value Rap. The resistance value Rap is higher than the resistance value Rp. States indicating two different resistance values can be assigned to two types of binary data, respectively.

When the write current $Iw_P$ flows from the ferromagnet 33 toward the ferromagnet 31, the magnetization direction of the ferromagnet 33 becomes parallel to the magnetization direction of the ferromagnet 31. On the other hand, when a write current $Iw_{AP}$ flows from the ferromagnet 31 toward the ferromagnet 33, the magnetization direction of the ferromagnet 33 becomes antiparallel to the magnetization direction of the ferromagnet 31.

Referring back to FIG. 3, the side face of the layer stack 24 is tapered. That is, the diameter of a top face 24T of the layer stack 24 is smaller than the diameter of a bottom face 24B of the layer stack 24. Alternatively, the area of the upper face 24T of the layer stack 24 is smaller than the area of the bottom face 24B of the layer stack 24. As used herein, the term "diameter" is not necessarily used for a circle, and does not require that the component for which the diameter is used be a circle. It refers to, for example, the linear distance from one end to another end in a shape close to a circle, and in the example of FIG. 3, it indicates the length of the component along the x axis. As an example, it indicates the length on an imaginary straight line passing through the center, and can be used interchangeably with the width. The side face of the layer stack 24 has an inclination of, for example, an angle θ1 with respect to the z axis.

A conductive nonmagnet 35 is provided on the top face of the layer stack 24, that is, on the top face of the ferromagnet 33, for example. The material of the nonmagnet 35 will be described later. The side face of the nonmagnet 35 is tapered. The side face of the nonmagnet 35 has an inclination of, for example, an angle θ2 with respect to the z axis. The angle θ2 is larger than the angle θ1.

The conductor 37 is provided on the top face of the nonmagnet 35. The conductor 37 functions as a cap layer.

The conductor 37 may be hereinafter referred to as a cap layer 37. The cap layer 37 includes, for example, one or more of platinum (Pt), tungsten (W), tantalum (Ta), and ruthenium (Ru), or is made of any one of platinum (Pt), tungsten (W), tantalum (Ta), and ruthenium (Ru). The side face of the cap layer 37 extends, for example, along the z axis.

A hard mask 38 is provided on the top face of the conductor 37. The hard mask 38 is made of, for example, a conductor.

Next, the material of the nonmagnet 35 will be described. The nonmagnet 35 has a first etching rate against ion beam etching (IBE) using a particular first ion beam described later. The cap layer 37 has a second etching rate for the IBE. The first etching rate is lower than the second etching rate. The nonmagnet 35 includes or is made of a material selected based at least in part on a kind of such first ion, the material of the cap layer 37, and the IBE condition. For example, the nonmagnet 35 may contain Ta, W, hafnium (Hf), iron (Fe), cobalt (Co), aluminum (Al), and molybdenum (Mo), or is made of any one of Ta, W, Hf, Fe, Co, Al, and Mo. When the nonmagnet 35 contains an element which exhibits magnetism as a single substance, or in the case where such an element is a main component, an element that weakens largely or eliminates the magnetism to the nonmagnet 35 can be added to the nonmagnet 35.

Alternatively, the nonmagnet 35 may be an alloy of two or more of Ta, W, Hf, Fe, Co, Al, and Mo. Furthermore, the nonmagnet 35 may contain one or more borides of Ta, W, Hf, Fe, Co, Al, and Mo.

A redeposited material 39 may lie on the side face of the nonmagnet 35, the side face of the cap layer 37, and part of the side face of the hard mask 38. The redeposited material 39 includes materials of at least one of the ferromagnet 31, the insulator 32, the ferromagnet 33, the nonmagnet 35, and the cap layer 37. The surface of the redeposited material 39 lies, for example, on the extension of the side face of the layer stack 24. For example, the surface of the redeposited material 39 and the surface of the layer stack 24 form a continuous flat surface.

The side face of the structure consisting of a set of the hard mask 38, the cap layer 37, the nonmagnet 35, the layer stack 24, and the redeposited material 39 may be covered with a sidewall insulator.

The hard mask 38 can be coupled to a conductor (not shown). An area other than the area in which the components shown in FIG. 3 are provided can be filled with an inter-layer insulator (not shown).

<1.2. Manufacturing Method>

With reference to FIGS. 5 to 8, a method of manufacturing the structure of FIG. 3 will be described. FIGS. 5 to 8 sequentially show the state during the manufacturing process of the portion, which is shown in FIG. 3, of the magnetoresistive memory device 1 of the first embodiment.

Figure 5:
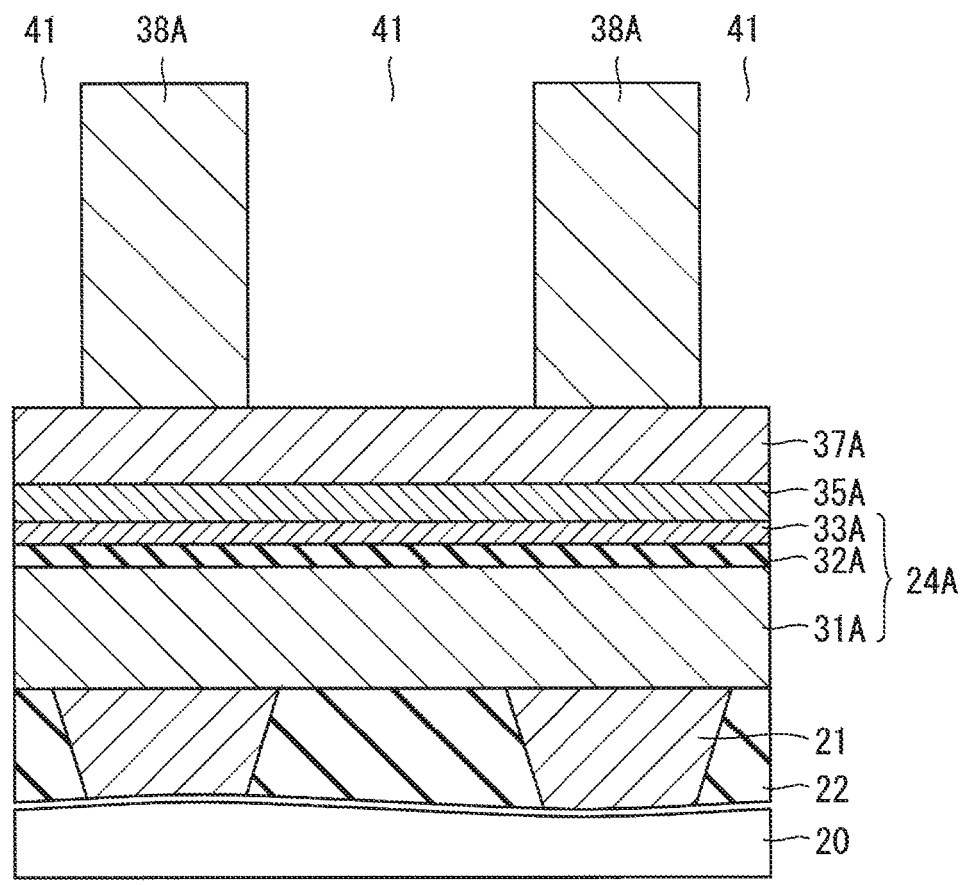
FIG. 5 shows a state during a manufacturing process of part of the magnetoresistive memory device of the first embodiment.

As shown in FIG. 5, the inter-layer insulator 22 and the bottom electrode 21 are formed above the surface extending along an xy plane of a substrate 20. A layer stack 24A is formed on the top face of the inter-layer insulator 22 and the top face of the bottom electrode 21. The layer stack 24A is later processed into the layer stack 24 and includes the same material layers as the material layers included in the layer stack 24. According to the current example, the layer stack 24A includes a ferromagnet 31A, an insulator 32A, and a ferromagnet 33A. The ferromagnet 31A, the insulator 32A, and the ferromagnet 33A include the same materials as the ferromagnet 31, the insulator 32, and the ferromagnet 33, respectively.

The ferromagnet 31A lies on the top face of the inter-layer insulator 22 and the top face of the bottom electrode. The insulator 32A lies on the upper face of the ferromagnet 31A. The ferromagnet 33A lies on the top face of the insulator 32A.

A nonmagnet 35A is formed on the top face of the layer stack 24A. The nonmagnet 35A is later processed into the nonmagnet 35, and includes the same material as the nonmagnet 35. A conductor 37A is formed on the top face of the nonmagnet 35A. The conductor 37A is later processed into the conductor 37 and includes the same material as the conductor 37.

Furthermore, a hard mask 38A is formed on the top face of the conductor 37A. The hard mask 38A remains in areas where the cap layers 37 are to be formed and have openings 41 in the remaining areas. The openings 41 extend from the top face to the bottom face of the hard mask 38A.

Figure 6:
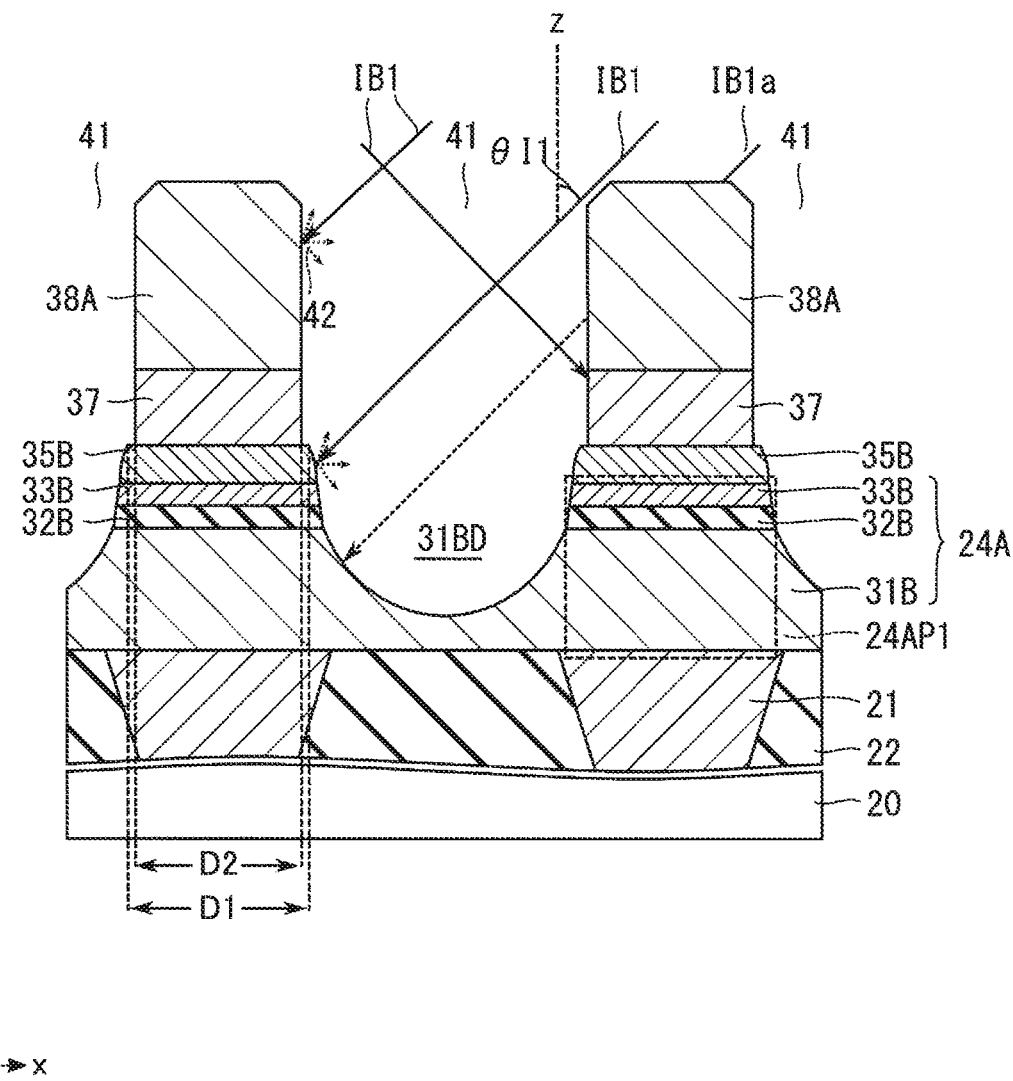
FIG. 6 shows a state following that of FIG. 5.

As shown in FIG. 6, the structure obtained by the process described so far is etched by the first IBE. The ions of the first IBE can be, for example, argon. The angle of the ion beam IB1 in the first IBE with respect to the normal to the surface of the substrate 20, that is, the angle θI1 with respect to the z axis, falls within a first range. In the following description, the angle of an ion beam with respect to z-axis may be referred to simply as the angle of the ion beam.

In general, when a component extending along the xy plane is partially removed and patterned by the IBE, the etching rate is different based on the angle of the ion beam. Also, a material 42 removed from the etching-target material by the IBE may be deposited on the surrounding components. The material thus redeposited is also removed again if the etching rate of the IBE is high. The angle of the ion beam IB1 in the first IBE is desired to be able to sufficiently suppress such redeposition, and the first range has, for example, a range including the highest etching rate. Specifically, the first range ranges, for example, from 30° to 60°.

On the other hand, when the angle of the ion beam is high, the ion beam having a trajectory such as that of the ion beam IB1a may be blocked by the hard mask 38A and may not reach a deep area of the opening 41 (an area closer to the substrate 20). In particular, in order to arrange the variable resistance element VR at a high density, the narrower the openings 41 of the hard mask 38A, the shallower area of the openings 41 (an area farther from the substrate 20) the ion beam can reach.

The conductor 37A is separated into several portions by the first IBE to form the cap layers 37, and the nonmagnet 35A is separated into several portions to form the nonmagnets 35B. As described above, for the first IBE, the nonmagnet 35A has the first etching rate, and the conductor 37A has the second etching rate higher than the first etching rate. Therefore, the side face of the nonmagnet 35A is etched less than the side face of the conductor 37A by the first IBE, and the diameter (or width) D1 of the nonmagnet 35B is larger than the diameter (or width) D2 of the cap layer 37. The diameter D1 is, for example, the diameter of the top face of the nonmagnet 35B, and the diameter D2 is, for example, the diameter of the bottom face of the cap layer 37.

Some of ion beams IB1 of the first IBE are blocked by the hard mask 38A and do not separate the layer stack 24A into portions. In the example of FIG. 6, the upper part of the layer stack 24A is divided into portions, and the lower part is not divided. In the example where the current layer stack 24A includes the ferromagnet 31A, the insulator 32A, and the ferromagnet 33A, the ferromagnet 33A is divided into ferromagnets 33B with each lying a hard mask 38A, and the insulator 32A is divided into insulators 32B with each lying below a remaining pattern of hard mask 38A. On the other hand, the ferromagnet 31A is processed into a ferromagnet 31B having a recess 31BD at the bottom of each opening 41 without being divided into portions each of which would lie below the hard mask 38A.

The lower portion of the hard mask 38A of the layer stack 24A (hereinafter referred to as a residual portion 24AP1 of the layer stack 24A) has a width larger than a width D2 of the cap layer 37 due to the nonmagnet 35B having a width larger than the width D2 of the cap layer 37. As an example, the width of the residual portion 24AP1 of the stacked structure 24A is larger than the width D2 of the cap layer 37 at any height.

The upper face of the hard mask 38A is lowered by the first IBE.

The material removed from the etching target by the first IBE may be redeposited on the surrounding components. However, since the first IBE has a high angle and provides a high etching rate to the etching target, the redeposited material is again removed by etching and the amount of redeposition in the first IBE is suppressed.

Figure 7:
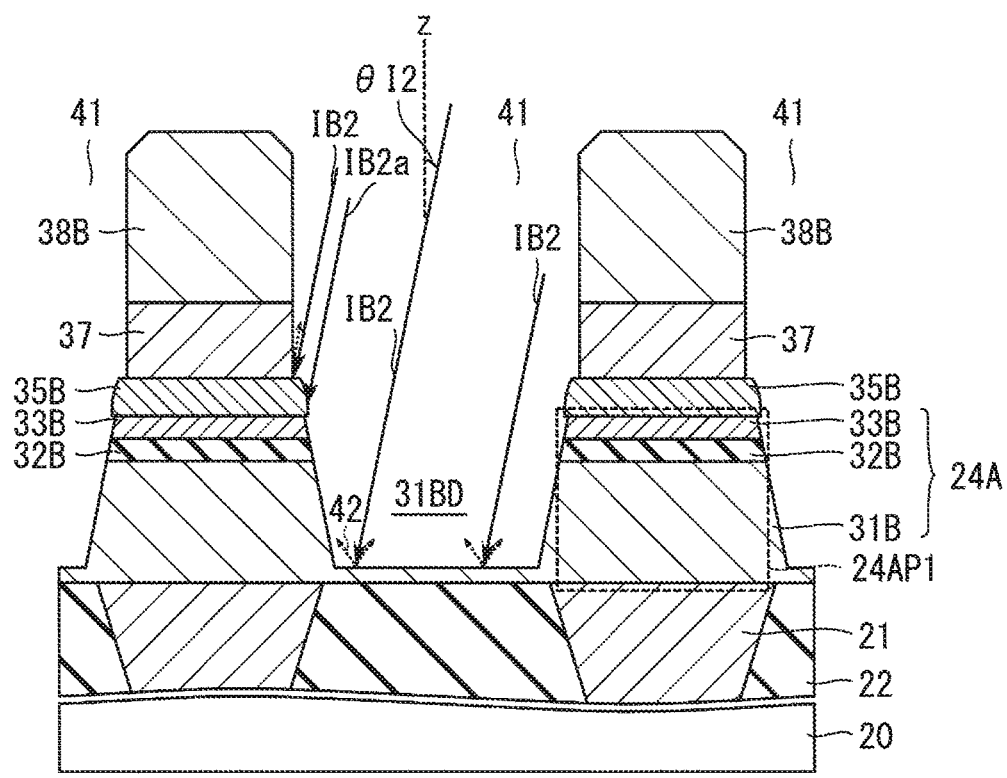
FIG. 7 shows a state following that of FIG. 6.

As shown in FIG. 7, the structure obtained by the process described so far is etched by a second IBE. The ions of the second IBE can be, for example, argon.

The angle θI2 of the ion beam in the second IBE falls within a second range. In the second IBE, the ion beam is intended to reach a lower part of the layer stack 24A through the openings 41. For this purpose, the second range is, for example, 0° to 30°, and the angle θI2 of the ion beam in the second IBE is, for example, 10°. Since such an ion beam having a low angle is used, the etching rate in the second IBE is low, at least lower than the etching rate in the first IBE.

By the second IBE using the ion beam having such an angle, some ion beams IB2 in the second IBE reach a lower part of the layer stack 24A, particularly the recess 31BD of the ferromagnet 31B. As a result, with the progress of the second IBE, the position of the bottom of the recess 31BD is lowered, and the width of the residual portion 24AP1 of the layer stack 24A is narrowed.

On the other hand, the ion beam having a trajectory such as an ion beam IB2a is blocked by the nonmagnet 35B and hardly reaches the region near the lower part of the nonmagnet 35B.

The upper face of the hard mask 38A is lowered by the second IBE to form a hard mask 38B.

Also by the second IBE, the material 42 removed from the etching target may be deposited on the surrounding components. In particular, because the etching rate of the second IBE is low, the second IBE cannot sufficiently suppress the progress of the redeposition, and the redeposition of the material 42 in the second IBE more easily progresses than the redeposition in the first IBE.

Figure 8:
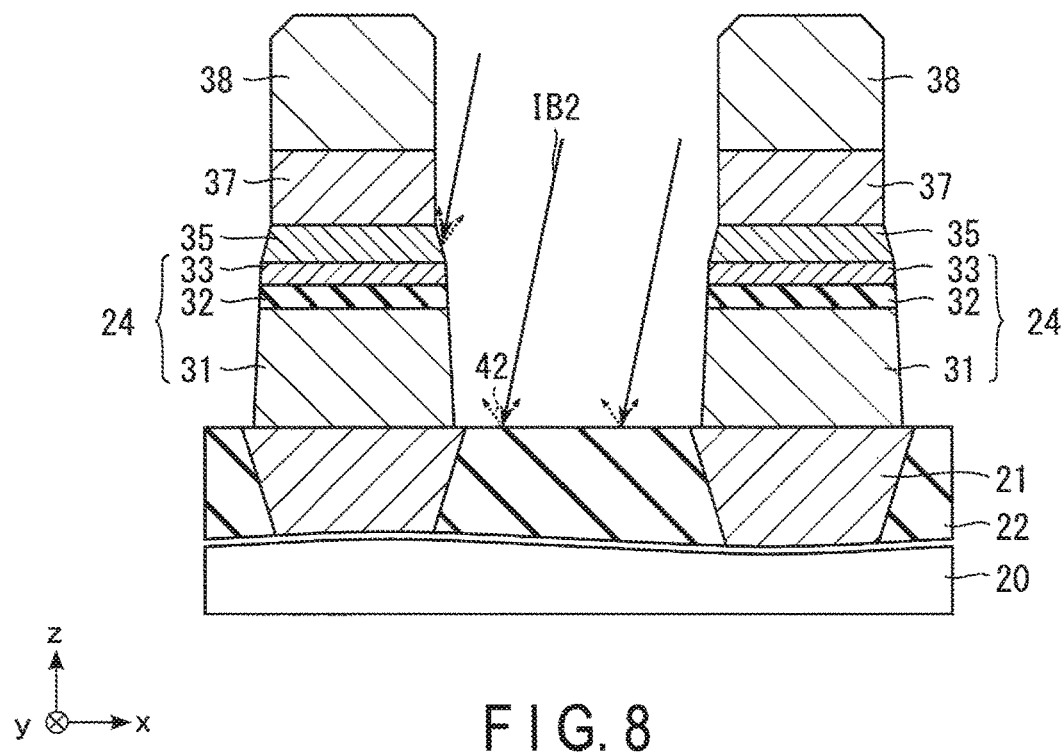
FIG. 8 shows a state following that of FIG. 7.

As shown in FIG. 8, the second IBE of FIG. 7 is continued. The ferromagnet 31B is formed into ferromagnets 31 by the second IBE. The nonmagnets 35B are also slowly etched by the second IBE to form the nonmagnets 35. While the top faces of the nonmagnets 35B are etched, the ion beam IB2 hardly or does not reach the ferromagnets 33B and the insulators 32. Thus, during this period, scattering of the material 42 removed from the ferromagnets 33B and the insulators 32B is suppressed, and redeposition by the material 42 from the ferromagnets 33B and the insulators 32B is suppressed.

As the top faces of the nonmagnets 35A are etched, the ion beam IB2 comes to reach a ferromagnets 33B and insulators 32B, and the ferromagnets 33B and the insulators 32B are formed into the ferromagnets 33 and the insulators 32 by the second IBE, respectively.

Further, the top face of the hard mask 38B is lowered by the second IBE, and becomes the hard mask 38.

By the second IBE, the material 42 removed from the etching target is deposited on the surrounding components, and as shown in FIG. 3, the redeposited material 39 may be formed by the material 42.

<1.3. Advantages (Effects)>

According to the first embodiment, the magnetoresistive memory device 1 including the high-performance variable resistance elements VR can be realized. The details are as follows.

Figure 9:
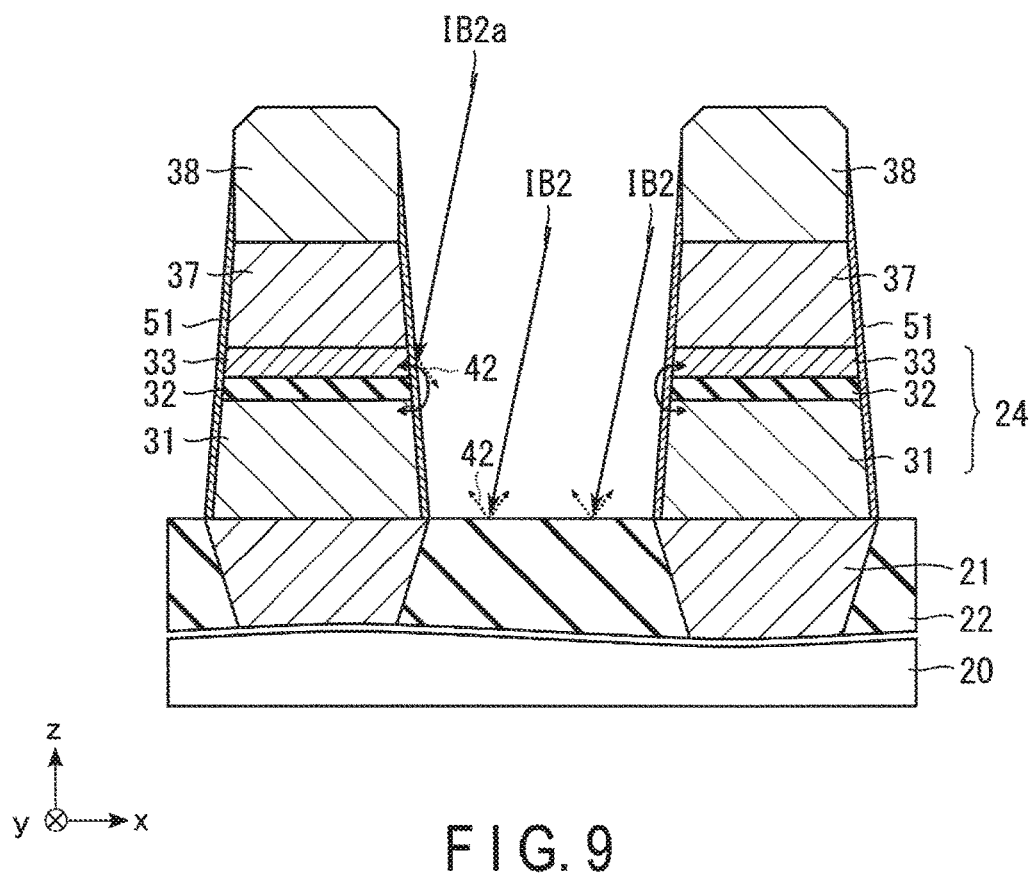
FIG. 9 shows a structure of part of a magnetoresistive memory device for reference.

FIG. 9 shows a state in a manufacturing process of a magnetoresistive memory device 100 for reference. Unlike the magnetoresistive memory device 1 of FIG. 3, the magnetoresistive memory device 100 does not include the nonmagnet 35. The process of FIG. 9 corresponds to the process of FIGS. 7 and 8 of the first embodiment.

The structure shown in FIG. 9 is etched by the second IBE using a low angle ion beam similar to FIG. 7. As described with reference to FIG. 7, the second IBE has a low etching rate to the etching target. Therefore, the etched material is likely to be redeposited on the surrounding components. In the structure shown in FIG. 9, the ion beam IB2a that has a trajectory interrupted by the top face of the nonmagnets 35 and does not reach the layer stack 24A in the structure of FIG. 7 etches the ferromagnets 33A from the start of the second IBE. On the other hand, since the etching rate of the second IBE is low, the removal of the redeposited material 42 removed from the ferromagnets 33A is slow, and the redeposition of the material 42 progresses. Therefore, redeposited materials 51 are formed on the side faces of the ferromagnets 31, the insulators 32, the ferromagnets 33, the cap layers 37, and the hard masks 38. Even when the second IBE is finished, in a case where a redeposited material 51 remains on the side wall of an insulator 32, the redeposited material 51 may cause partial or full electrical conduction between the ferromagnets 31 and 33. This may suppress production of the designed and intended magnetoresistive effect of the layer stacks 24, and may disable the layer stacks 24 from functioning as MTJ elements.

According to the first embodiment, the variable resistance element VR includes the nonmagnet 35. Since the nonmagnet 35 contains a material having an etching rate lower than that of the cap layer 37 with respect to a particular IBE, the nonmagnet 35A, which is formed into the nonmagnet 35, has a diameter larger than that of the conductor 37A as a result of the IBE using a high angle ion beam performed earlier (for example, the first IBE). For this reason, in the IBE using a low angle ion beam performed after the IBE using a high angle ion beam (for example, the second IBE), some of ion beams (for example, the IB2a) is blocked by the top face of the nonmagnet 35B until the corner of the top face of nonmagnet 35A is scrapped and does not reach the ferromagnet 33B. Therefore, the redeposition of the material 42 on the side face of the insulator 32 in the second IBE is suppressed, and the conduction between the ferromagnets 31 and 33 is suppressed. Therefore, it is possible to make the layer stack 24 that can exhibit the intended magnetoresistive effect.

<1.4. Modification and Others>

The first embodiment relates to an example in which the ferromagnet 31 under the insulator 32 functions as a reference layer and the ferromagnet 33 on the insulator 32 functions as a storage layer. The first embodiment is not limited to this example, and can be applied to an example in which the ferromagnet 31 is located on the insulator 32 and the ferromagnet 33 is located under the insulator 32.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetoresistive memory device, the method comprising:
    forming a first layer stack above a substrate, the first layer stack comprising a first ferromagnet, an insulator above the first ferromagnet, a second ferromagnet above the insulator, a nonmagnet above the second ferromagnet, and a first conductor above the nonmagnet;
    forming a hard mask having an opening on the first layer stack;
    irradiating, through the opening, the first layer stack with a first ion beam traveling at a first angle with respect to a normal to the substrate, the nonmagnet being etched at a first etching rate by the first ion beam, the first conductor being etched at a second etching rate by the first ion beam, and the first etching rate being lower than the second etching rate; and
    irradiating, through the opening, the first layer stack with a second ion beam traveling at a second angle with respect to the normal to the substrate, the second angle being smaller than the first angle.

2. The method according to claim 1, wherein:
the nonmagnet comprises one boride of tantalum, tungsten, hafnium, iron, cobalt, aluminum, and molybdenum.

3. The method according to claim 1, wherein:
the nonmagnet comprises one of tantalum, tungsten, hafnium, iron, cobalt, aluminum, and molybdenum.

4. The method according to claim 3, wherein:
the first conductor comprises one of platinum, tungsten, tantalum, and ruthenium.

5. The method according to claim 3, wherein:
the first conductor comprises one of platinum, tungsten, tantalum, and ruthenium.

* * * * *